United States Patent
McGrath et al.

(10) Patent No.: US 10,861,892 B2
(45) Date of Patent: Dec. 8, 2020

(54) LOW-LIGHT-LEVEL CMOS IMAGE SENSOR PIXEL

(71) Applicant: BAE SYSTEMS Information and Electronic Systems Integration Inc., Nashua, NH (US)

(72) Inventors: Robert Daniel McGrath, Lexington, MA (US); Stephen P. Tobin, Carlisle, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/198,298

(22) Filed: Nov. 21, 2018

(65) Prior Publication Data
US 2020/0161358 A1    May 21, 2020

(51) Int. Cl.
*H01L 27/146* (2006.01)

(52) U.S. Cl.
CPC .. *H01L 27/14627* (2013.01); *H01L 27/14607* (2013.01); *H01L 27/14614* (2013.01); *H01L 27/14643* (2013.01)

(58) Field of Classification Search
CPC ......... H01L 27/14627; H01L 27/14607; H01L 27/14614; H01L 27/14643
See application file for complete search history.

(56) References Cited

U.S. PATENT DOCUMENTS

| | | | | |
|---|---|---|---|---|
| 7,667,183 B2 * | 2/2010 | Lee | .................. | H01L 27/14603 250/214.1 |
| 7,732,846 B2 * | 6/2010 | Ohkawa | ............ | H01L 27/14641 257/292 |
| 8,723,990 B2 * | 5/2014 | Hynecek | ........... | H01L 27/14603 348/241 |
| 8,860,099 B2 * | 10/2014 | Tatani | ............... | H01L 27/14603 257/291 |
| 8,976,283 B2 * | 3/2015 | Ishiwata | ........... | H01L 27/14621 348/308 |
| 9,225,922 B2 * | 12/2015 | Lee | ........................ | H04N 5/357 |
| 9,319,606 B2 * | 4/2016 | Nakata | .............. | H01L 27/14612 |
| 9,362,319 B2 * | 6/2016 | Tashiro | ............. | H01L 27/14603 |
| 9,583,527 B1 * | 2/2017 | Leung | ............... | H01L 27/14636 |
| 10,068,940 B2 * | 9/2018 | Koizumi | .......... | H01L 27/14607 |
| 10,103,190 B2 * | 10/2018 | Korobov | ........... | H01L 27/14605 |
| 10,110,839 B2 * | 10/2018 | Mlinar | ................. | H04N 5/3592 |
| 10,177,192 B2 * | 1/2019 | Lee | ........................ | H04N 5/3696 |
| 10,204,957 B2 * | 2/2019 | Murata | .............. | H04N 5/37452 |
| 10,249,666 B2 * | 4/2019 | Pyo | .................... | H01L 27/14627 |
| 10,312,279 B2 * | 6/2019 | Borthakur | ......... | H01L 27/14605 |
| 10,325,953 B2 * | 6/2019 | Kawahito | ............... | G01S 7/481 |
| 10,462,402 B2 * | 10/2019 | Fan | .................... | H01L 27/14616 |

(Continued)

OTHER PUBLICATIONS

International Search Report, PCT/US2019/062208, dated Feb. 11, 2020, 8 pages.

*Primary Examiner* — Ida M Soward
(74) *Attorney, Agent, or Firm* — Maine Cernote & Rardin; Scott J. Asmus

(57) ABSTRACT

A system for low light level image sensing is provided having: A photodiode; a transfer gate disposed in a center of the photodiode; an active gate disposed surrounded by the transfer gate; a plurality of microlenses, each microlens being disposed over a portion of the photodiode and directing light away from the transfer gate towards the photodiode.

19 Claims, 4 Drawing Sheets

(56) References Cited

U.S. PATENT DOCUMENTS

| | | | |
|---|---|---|---|
| 10,573,678 B2* | 2/2020 | Chapman | G02B 13/16 |
| 10,608,026 B2* | 3/2020 | Go | H01L 27/14641 |
| 10,608,032 B2* | 3/2020 | Yun | H01L 27/14614 |
| 2005/0194617 A1* | 9/2005 | Sugiyama | H01L 27/14603 257/222 |
| 2008/0258187 A1* | 10/2008 | Ladd | H01L 27/14603 257/292 |
| 2008/0296643 A1* | 12/2008 | Inoue | H01L 27/14627 257/292 |
| 2009/0184349 A1* | 7/2009 | Dungan | H01L 27/14634 257/292 |
| 2013/0313411 A1* | 11/2013 | Ui | H04N 5/35545 250/208.1 |
| 2015/0092094 A1* | 4/2015 | Itonaga | H01L 27/14603 348/300 |
| 2016/0218138 A1* | 7/2016 | Oishi | H01L 27/14643 |
| 2016/0358967 A1* | 12/2016 | Madurawe | H01L 27/14634 |
| 2017/0170230 A1* | 6/2017 | Kumano | H01L 27/14629 |
| 2017/0237917 A1* | 8/2017 | Sato | H04N 5/363 348/308 |
| 2017/0287966 A1* | 10/2017 | Liu | H01L 21/32053 |
| 2017/0324915 A1* | 11/2017 | Geurts | H04N 5/3532 |
| 2019/0115388 A1* | 4/2019 | Jung | H01L 27/14643 |
| 2019/0131340 A1* | 5/2019 | Kim | H01L 27/1463 |
| 2019/0378864 A1* | 12/2019 | Innocent | H01L 27/14614 |
| 2020/0161363 A1* | 5/2020 | Ihara | H01L 27/14614 |
| 2020/0176499 A1* | 6/2020 | Park | H01L 27/14645 |

\* cited by examiner

LOW-LIGHT-LEVEL CMOS IMAGE SENSOR PIXEL

STATEMENT OF GOVERNMENT INTEREST

This invention was made with government support under Contract No. W1SP7T-06-D-E402/S3/BD34. The United States Government has certain rights in the inventions.

FIELD

The invention relates to photodiode construction, and more particularly, to a circular photodiode having at least one microlens disposed above the photodiode.

BACKGROUND

Designs for a CIS pixel with increased sensitivity through large size and low noise while not compromising other performance have been sought, however such designs have proved elusive in large pixel applications. Large pixels can suffer from lag issues due to the long path required for charge readout from the large photodiode; light collection is impaired because of the problem of making a large microlens; low noise is further impaired by the problem of connecting the conversion node to the active readout transistors. In a traditional CIS design these conflict with each other.

What is needed, therefore, are techniques for decreasing lag time and improving light collection.

SUMMARY

One embodiment provides system for low light level image sensing, the system comprising: A photodiode; a transfer gate disposed in a center of the photodiode; an active gate disposed surrounded by the transfer gate; a plurality of microlenses, each microlens being disposed over a portion of the photodiode and directing light away from the transfer gate towards the photodiode.

Another embodiment provides a channel disposed between the microlenses running from an exterior edge of the photodiode to a center point in the pixel.

A further embodiment provides such a system wherein the transfer gate comprises at least one segment of transfer gate.

Yet another embodiment provides such a system wherein the transfer gate has a single interruption in its circumference.

A yet further embodiment provides such a system wherein the transfer gate has a plurality of interruptions in its circumference.

Even another embodiment provides such a system wherein the plurality of interruptions comprises two or more evenly spaced interruptions in the transfer gate.

An even further embodiment provides such a system wherein the plurality of microlenses comprise four microlenses disposed in quadrants of the photodiode.

Still another embodiment provides such a system wherein the four microlenses are arranged in a 2×2 array.

A still further embodiment provides such a system wherein the plurality of microlenses comprise six microlenses.

Even still another embodiment provides such a system further comprising at least one connector disposed in the channel between the transfer gate and circuitry disposed externally to a pixel comprising the system.

An even still further embodiment provides such a system further comprising circuitry disposed within the channel.

Even another embodiment provides such a system further comprising a resister coupled to area enclosed by transfer gate and substrate.

One embodiment provides a sensor array, the sensor array comprising: a plurality of pixels; each pixel comprising a photodiode, a transfer gate and an active gate, wherein the transfer gate is surrounded by the photodiode and the active gate is surrounded by the transfer gate; an array of microlenses disposed over the photodiode, directing light away from the transfer gate and the active gate and into the photodiode; and a plurality of channels, each channel being disposed between at least two microlenses in the array.

Another embodiment provides such a sensor array wherein each transfer gate comprises at least one segment of the transfer gate.

A further embodiment provides such a sensor array wherein the transfer gate has a single interruption in its circumference.

Still another embodiment provides such a sensor array wherein the transfer gate has a plurality of interruptions in its circumference.

A still further embodiment provides such a sensor array wherein the plurality of interruptions comprises two or more evenly spaces interruptions in the transfer gate.

Even another embodiment provides such a sensor array wherein the plurality of microlenses comprises four microlenses disposed in quadrants of the photodiode.

An even further embodiment provides such a sensor array wherein the four microlenses are disposed in a 2×2 array.

Yet another embodiment provides such a sensor array further comprising at least one connector disposed in the channel between the transfer gate and circuitry disposed externally to a pixel comprising the system.

A yet further embodiment provides such a sensor array further comprising circuitry disposed within the channel.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
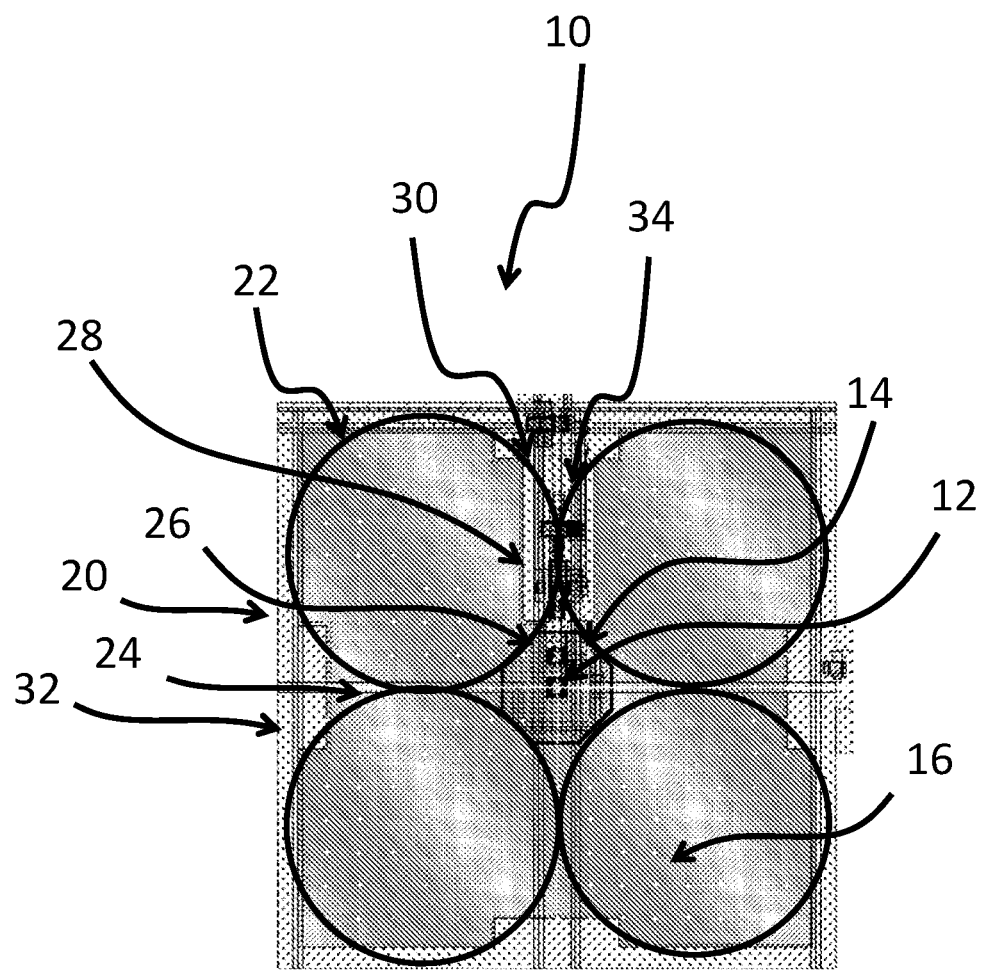
FIG. 1 is a block diagram illustrating a photo diode pixel configured in accordance with one embodiment.

One embodiment uses a design, illustrated in FIG. 1 where a conversion node diffusion 12 is located at the center of a pixel 10, the transfer gate 14 is a surrounding ring which controls either complete (as in FIG. 2) or segmented transfer channels (as in FIG. 3) from the photodiode 16 to the conversion node diffusion 12, an array 20 of microlenses 22 are used in each pixel 10 to direct light to the center of the photodiodes 16 and away from the center of the pixel 10 and the channels between the photodiodes 16. In one embodiment, areas to which light is not directed by the microlenses 22 allow internal paths 24 and interconnects 26 between the conversion node diffusion 12 and the active transistor 28 and for locating related circuits 30 with minimum impact on optical collection. Circuits 30 can be placed between adjoin pixels at the edge of the pixel 32, leaving open the photodiode areas 16 for unencumbered light collection or can be placed in the lanes between photodiodes within the pixel 34 where the microlenses abut to provide shorter connections and resulting in improved conversion gain and decreased noise as expressed in electrons or holes with minimum loss of optical response. The interconnect portion of the conversion node (that is, the connection from diode to active transistor) can have minimized capacitance through bus separation and through choosing the interconnect to be on a higher interconnect metal layer (for instance, on metal 2 rather than metal 1).

Figure 3:
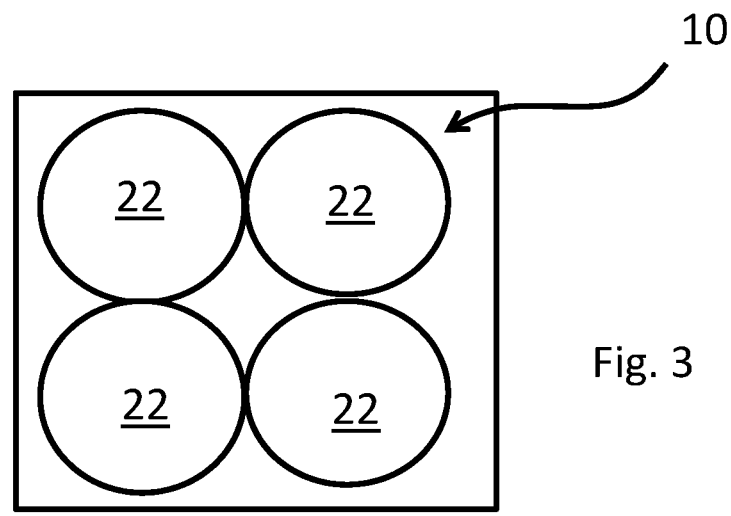
FIG. 3 is a block diagram illustrating a photo diode pixel configured in accordance with one embodiment and having four microlenses disposed thereupon.
Figure 4:
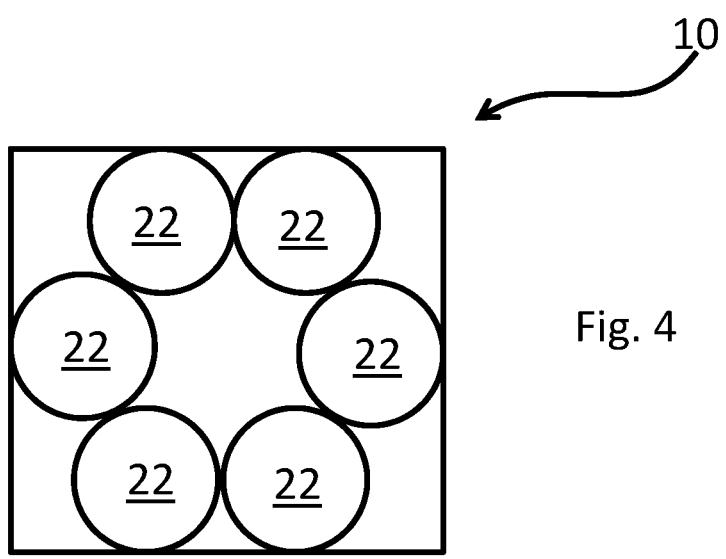
FIG. 4 is a block diagram illustrating a photo diode pixel configured in accordance with one embodiment and having six microlenses disposed thereupon.

As illustrated in FIGS. 3 and 4, configuration where embodiments having four or six microlenses 22, and associated photodiodes are disclosed. One skilled in the art will appreciate that other configurations with different numbers of microlenses 22 could would also be within the scope of this disclosure.

Figure 5:
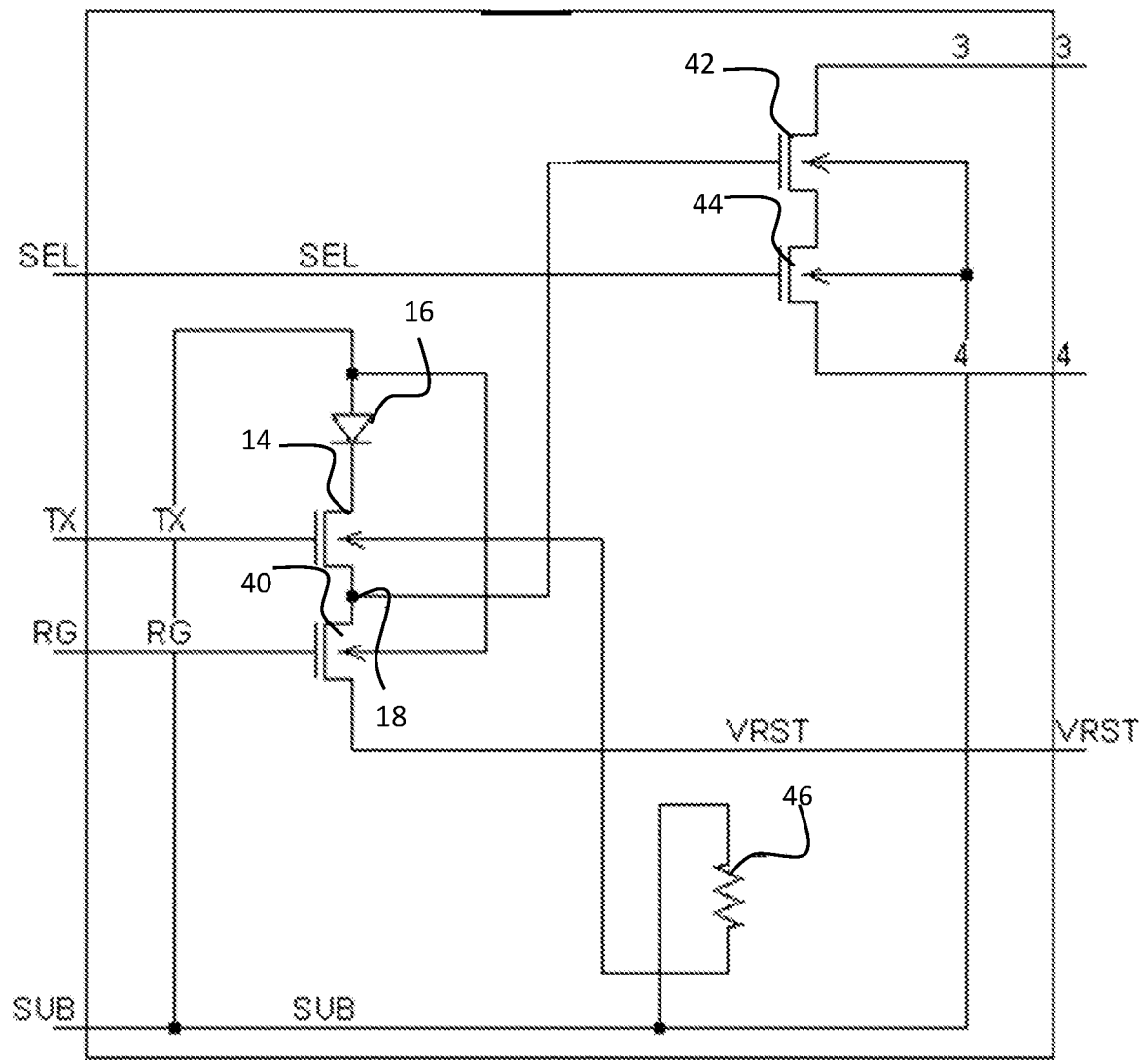
FIG. 5 is a circuit diagram illustrating a photo diode pixel configured in accordance with one embodiment.

FIG. 5 illustrates a schematic of a pixel thus configured. A photodiode 16 is coupled to a transfer FET 14 and reset FET 40 with the diffusion in between coupled to an active FET 42. The photodiode 16 holds the photo-generated signal charge, the reset FET 40 alternately resets the intermediate node 18 and then isolates it, and the transfer FET 14 transfers the signal charge onto the intermediate node 18 for readout. When the select FET 44 is biased to be on, current flows through the circuit made up of the active FET 42 and the select FET 44 with the voltage on the Output 4 of the active FET 42 following the voltage on the intermediate node 18. This voltage can be read both after the intermediate node 18 is reset and after the transfer FET 14 has transferred the charge so that the difference in signal on the Output 4 provides a measure of the light collected on the photodiode 16. The active FET 42 is used to sense the potential while a select FET 44 controls whether the pixel is activated or not. A parasitic resistance 46 exists between the substrate under transfer FET 14 and is designed to be small so as to provide good transfer FET 14 operation, minimizing the impact of clocking the gate of the transfer FET 14.

Figure 2:
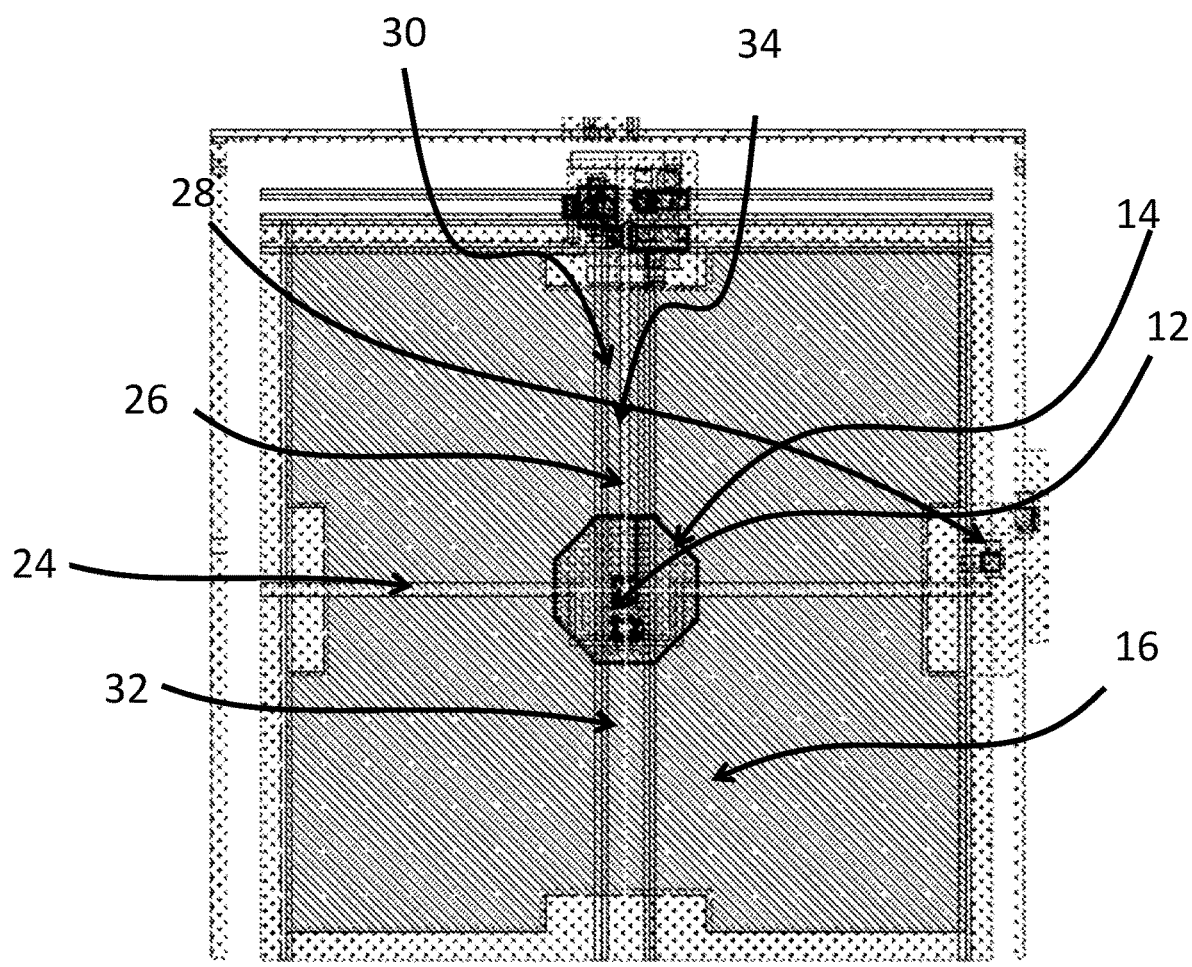
FIG. 2 is a block diagram illustrating a photo diode pixel configured in accordance with one embodiment wherein the photodiode comprises a complete ring around the transfer gate.

One embodiment provides a system, as shown in FIGS. 1 and 2, for low light level image sensing. including a photodiode 16; a transfer gate 14 disposed in a center of the photodiode 16; an active gate 28 disposed surrounded by the transfer gate 14; a plurality of microlenses 22, each microlens 22 being disposed over a portion of the photodiode 16 and directing light away from the transfer gate 14 towards the photodiode 16.

Another embodiment provides a channel 34 disposed between the microlenses 16 running from an exterior edge of the photodiode 16 to a center point in the pixel 10.

A further embodiment provides such a system wherein the transfer gate 14 includes at least one segment of the transfer gate or the transfer gate 14 has a single interruption in its circumference. Alternatively the transfer gate 14 could have a plurality of interruptions in its circumference. In such an embodiment, the plurality of interruptions includes two or more evenly spaced interruptions in the transfer gate 14.

In such a system configured according to embodiments, the plurality of microlenses 22 may include four, as in FIG. 3 or six, as in FIG. 4 or some other number of microlenses 22 disposed in regions of the photodiode 16. In such an embodiment the four microlenses 22 may be arranged in a 2×2 array.

In embodiments such a system may further include at least one connector disposed in the channel between the transfer gate and circuitry disposed externally to a pixel comprising the system and may further include circuitry disposed within the channel.

In embodiments, the system may have a resistor coupled to an area enclosed by the transfer gate and substrate.

One embodiment provides a sensor array, the sensor array including: a plurality of pixels 10 as described above; each pixel including a photodiode 16, a transfer gate 14 and an active gate 28, wherein the transfer gate 14 is surrounded by the photodiode 16 and the active gate 28 is surrounded by the transfer gate 14; an array of microlenses 22 disposed over the photodiode 16, directing light away from the transfer gate 14 and the active gate 28 and into the photodiode 16; and a plurality of channels, 34 each channel 34 being disposed between at least two microlenses 16 in the array.

Embodiments may provide such a sensor array wherein each transfer gate 14 includes at least one segment of transfer gate 14 or where each transfer gate has a single interruption in its circumference or plurality of interruptions in its circumference. If there is a plurality of interruptions in its circumference, the interruptions may be evenly spaced at interruptions in the transfer gate 14. The microlenses 22 may be four, six or another number of microlenses disposed in evenly around the photodiode 16.

Embodiments may provide a sensor array with at least one connector disposed in the channel between the transfer gate 14 and circuitry disposed externally to a pixel 10 included in the system and may further include circuitry disposed within the channel.

The foregoing description of the embodiments has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system comprising:
   a pixel comprising a photodiode;
   a ring-shaped transfer gate disposed in a center of said photodiode;
   a conversion node disposed surrounded by said transfer gate;
   a plurality of microlenses, each said microlens being disposed over a portion of said photodiode and directing light away from said transfer gate towards said photodiode;
   a channel disposed between said microlenses running from an exterior edge of said photodiode to a center point in said pixel; and
   a circuitry disposed within said channel.

2. The system of claim 1 wherein said transfer gate comprises at least one segment of said transfer gate.

3. The system of claim 2 wherein said transfer gate has a single interruption in its circumference.

4. The system of claim 2 wherein said transfer gate has a plurality of interruptions in its circumference.

5. The system of claim 4 wherein said plurality of interruptions comprises two or more evenly spaced interruptions in said transfer gate.

6. The system of claim 1 wherein said plurality of microlenses comprises four microlenses disposed in quadrants of said photodiode.

7. The system of claim 6 wherein said four microlenses are arranged in a 2×2 array.

8. The system of claim 1 wherein said plurality of microlenses comprises six microlenses.

9. The system of claim 1 further comprising at least one connector disposed in said channel between said transfer gate and circuitry disposed externally to said pixel comprising said system.

10. The system of claim 1 further comprising a resistor coupled to said conversion node.

11. The sensor array of claim 1 further comprising at least one connector disposed in said channel between said transfer gate and circuitry disposed externally to said pixel comprising said array.

12. The sensor array of claim 1 further comprising circuitry disposed within said channel.

13. A sensor array, comprising:
a plurality of pixels;
each said pixel comprising a photodiode, a transfer gate and a conversion node, wherein said transfer gate is surrounded by said photodiode and an active gate is surrounded by said transfer gate;
an array of microlenses disposed over said photodiode, directing light away from said transfer gate and said conversion node and into said photodiode; and
a plurality of channels, each said channel being disposed between at least two microlenses in said array of microlenses.

14. The sensor array of claim 13 wherein each said transfer gate comprises at least one segment of said transfer gate.

15. The sensor array claim 14 wherein said transfer gate has a single interruption in its circumference.

16. The sensor array of claim 14 wherein said transfer gate has a plurality of interruptions in its circumference.

17. The sensor array of claim 16 wherein said plurality of interruptions comprises two or more evenly spaced interruptions in said transfer gate.

18. The sensor array of claim 13 wherein said plurality of microlenses comprises four microlenses disposed in quadrants of said photodiode.

19. The sensor array of claim 18 wherein said four microlenses are disposed in a 2×2 array of microlenses.

* * * * *